United States Patent [19]
Rotker et al.

[11] Patent Number: 5,263,030
[45] Date of Patent: Nov. 16, 1993

[54] METHOD AND APPARATUS FOR ENCODING DATA FOR STORAGE ON MAGNETIC TAPE

[75] Inventors: Paul S. Rotker, West Newton; Eric W. Ertel, Milford, both of Mass.

[73] Assignee: Digital Equipment Corporation, Maynard, Mass.

[21] Appl. No.: 654,499

[22] Filed: Feb. 13, 1991

[51] Int. Cl.⁵ .................. G06F 11/08; H03M 13/00; H03M 13/22
[52] U.S. Cl. ................... 371/39.1; 371/37.5; 371/40.1; 371/40.4
[58] Field of Search .......... 371/39.1, 37.5, 40.1, 371/40.2, 40.4

[56] References Cited

U.S. PATENT DOCUMENTS

| | | | |
|---|---|---|---|
| 4,276,647 | 6/1981 | Thacker | 371/39.1 |
| 4,394,642 | 7/1983 | Currie et al. | 340/347 |
| 4,513,420 | 4/1985 | Collins | 371/40.4 |
| 4,564,945 | 1/1986 | Glover et al. | 371/38 |
| 4,604,750 | 8/1986 | Manton | 371/40.2 |
| 4,646,170 | 2/1987 | Kobayashi et al. | 360/22 |
| 4,672,614 | 6/1987 | Yoshida | 371/40.2 |
| 4,742,517 | 5/1988 | Takagi et al. | 371/2 |
| 4,791,643 | 12/1988 | Molstad et al. | 371/40 |
| 4,796,110 | 1/1989 | Glass et al. | 360/53 |
| 4,852,102 | 7/1989 | Yamaguchi | 371/40 |
| 4,866,717 | 9/1989 | Murai et al. | 371/40.3 |
| 4,890,287 | 12/1989 | Johnson et al. | 371/37.2 |
| 4,910,736 | 3/1990 | Tanaka et al. | 371/37.7 |
| 5,127,014 | 6/1992 | Raynham | 371/40.2 X |

FOREIGN PATENT DOCUMENTS

55-87397  2/1980  Japan .................. 371/40.2

OTHER PUBLICATIONS

Bliss et al., Error Correction Code, IBM Technical Disclosure Bulletin vol. 23 No. 10, Mar. 1981, pp. 4629–4632.

*Primary Examiner*—Robert W. Beausoliel, Jr.
*Assistant Examiner*—Glenn Snyder
*Attorney, Agent, or Firm*—Cesari and McKenna

[57] ABSTRACT

A data encoding system for storing data on a "c"-channel tape interleaves and encodes "b" multi-symbol data blocks as they are being serially sent to the tape for storage, using a (b+k,k) error correction code to generate k multi-symbol ECC blocks. It then serially records the k ECC blocks. The system receives corresponding data symbols from the first c data blocks in a predetermined order and applies the symbols both to the tape for recording and to an encoder. The encoder, before it receives the data symbols is set to a predetermined state. The encoder then manipulates the data and generates residue symbols associated with both the manipulation of the received data symbols and the state of the encoder immediately prior to such manipulation, and temporarily stores the generated residue symbols. Next, the system retrieves stored residue symbols which are associated with selected data symbols from previously recorded data blocks, sets the encoder to a state identified by the retrieved symbols and repeats its encoding, recording and storing processes for all received data symbols, as the received data symbols are being serially recorded on the tape. After the b data blocks are recorded, the system records the residue symbols corresponding to the manipulation of b data blocks.

11 Claims, 7 Drawing Sheets

METHOD AND APPARATUS FOR ENCODING DATA FOR STORAGE ON MAGNETIC TAPE

FIELD OF INVENTION

The invention relates generally to error correction of data and more particularly to improved techniques for coding data for storage on magnetic tape.

BACKGROUND

The importance of error correction coding of data in digital computer systems has increased greatly as the density of the data recorded on mass storage media, for example, magnetic tapes, has increased. With higher recording densities, a tiny imperfection in the recording surface of a tape can corrupt a large amount of data. In order to avoid losing that data, error correction codes ("ECC's") are employed to, as the name implies, correct the erroneous data.

Before a string of data symbols is recorded on a tape, it is mathematically encoded to form ECC symbols. The ECC symbols are then appended to the data string to form code words—data symbols plus ECC symbols—and the code words are then stored on the tape. When the stored data is to be retrieved from the tape, the code words containing the data symbols are retrieved from the tape and mathematically decoded. During decoding any errors in the data are detected and, if possible, corrected through manipulation of the ECC symbols [For a detailed description of decoding see Peterson and Weldon, *Error Correction Codes*, 2d Edition, MIT Press, 1972].

Stored digital code words can contain multiple errors. One of the most effective types of ECC used for the correction of multiple errors is a Reed-Solomon code [For a detailed description of Reed-Solomon codes, see Peterson and Weldon, *Error Correction Codes*]. Error detection and correction techniques for Reed-Solomon ECC's are well known. Id.

Data is typically stored on a tape in a long sequence of symbols. Errors in the stored data often occur in long bursts, that is, in a succession of many erroneous symbols. Techniques designed for detecting and/or correcting single or multiple independent errors, which do not ordinarily occur in bursts, are not well suited for the detection or correction of these long burst errors. Thus special error detection and/or correction techniques are typically employed to handle the long burst errors. One such technique is interleaving, which involves encoding into a single code word data symbols which are recorded non-continuously on the tape.

Known tape storage systems which use interleaved encoding start an encoding operation by storing in a data buffer the data symbols to be encoded. The systems then retrieve the data symbols from the data buffers in the order required for ECC encoding, and encode them to generate ECC redundancy symbols. Next, the systems store the generated ECC redundancy symbols in the data buffers along with the data. Finally, the systems retrieve the data and ECC symbols from the data buffers in the order in which they are to be recorded and serially record them on the tapes. The ordered sequence of data symbol buffering, encoding, ECC redundancy symbol buffering and recording operations take a relatively long time to perform in order to arrange the data and generated ECC redundancy symbols for serial recording.

The faster the data can be encoded to form interleaved ECC redundancy symbols, the faster the system can perform recording operations and the more recording operations it can perform in a given amount of time. The effective data transfer rate thus increases as the speed of error correction encoding increases. Accordingly, a mechanism is desirable for quickly interleaving and encoding data symbols using a code which protects them from long burst errors.

SUMMARY

A data encoding system for storing data on a "c"-channel tape interleaves and encodes "b" multi-symbol data blocks as they are being serially sent to the tape for storage, using a (b+k,k) error correction code to generate k multi-symbol ECC blocks. It then serially records the k ECC blocks. Assume that the tape is a two channel tape and that the ECC is a (20,4) code, that is, $c=2$, $b=16$ and $k=4$. The ECC thus encodes 16 data symbols and generates 4 ECC symbols to form a 20-symbol code word.

Before the system records the data blocks, it stores them along with 4 all-ZERO preliminary ECC blocks in a buffer, schematically a matrix with the data blocks stored in rows and the ECC blocks arranged beneath the data. The buffer thus schematically aligns the corresponding symbols of the data blocks and ECC blocks in columns. The ECC block symbols stored in a particular column relate to the encoding of the data symbols in the same column.

The system retrieves the preliminary ECC symbols from the first storage location of each of the ECC blocks, schematically the symbols in the first column of the buffer rows assigned to the ECC blocks, and uses them to initialize an ECC encoder. It then serially retrieves the first data symbols from the first 2 data blocks to be recorded in the 2 channels of the tape and sends the symbols both to the tape for recording and to the initialized ECC encoder.

The ECC encoder manipulates the retrieved data symbols and generates a corresponding residue. The system then temporarily stores this residue in the first storage locations of the ECC buffer rows, that is, in the first column.

Next, the system retrieves the second all-ZERO preliminary ECC symbols from each of the ECC buffer rows, that is, the symbols in the second column, and uses them to reinitialize the encoder. It serially retrieves the second data symbols in the first 2 data blocks and sends these symbols to both the tape for recording and the re-initialized ECC encoder. While the system records the symbols on the tape, the ECC encoder manipulates them and generates a corresponding residue. The system then temporarily stores this residue in the ECC storage locations in the second column.

The system repeats these retrieval, recording and residue generating steps until all the data symbols of the first 2 data blocks have been both manipulated in the ECC encoder and recorded on the tape.

The system is now ready to retrieve, manipulate and record data blocks 3 and 4. It first restores the ECC encoder to the state in which it was in after it manipulated the symbols in the first column of the first 2 blocks by loading into the encoder the corresponding residue, which is stored in the first column of the ECC storage locations. Next, it serially retrieves the first data symbols from blocks 3 and 4 and applies them to the tape and the restored ECC encoder. While the system records the symbols on the tape, the ECC encoder manipulates the symbols and generates a new residue, which now corresponds to the first symbols in blocks 1, 2, 3 and 4. The system then stores this new residue in the ECC locations in the first column.

The system continues in this manner until all of the data symbols in these next 2 data blocks have been manipulated and recorded. The system then repeats its retrieval, manipulation and storage operations for blocks 5 and 6, 7 and 8, and so forth. After all the data symbols in these blocks have been manipulated by the ECC encoder, the system has stored a set of residues, each of which corresponds to a column of data symbols. These residues are the ECC symbols which together with the corresponding data columns form code words in the (20,4) ECC. The system records the ECC symbols, or residues, serially on the various channels of the tape and thereby interleaves the ECC symbols to further protect the data from losses caused by long burst errors.

The system effectively interleaves and encodes the data to generate ECC symbols while the data is serially streaming to the tape, that is, "on-the-fly." The system performs data manipulation in parallel with the recording, and thus, it can use the time the system spends actually recording the data on the tape to perform the required ECC data manipulation. Accordingly, the system can record data faster than conventional systems, which interleave, encode and serially arrange the data and the generated ECC symbols before recording them on the tape.

BRIEF DESCRIPTION OF THE DRAWINGS

The above and further advantages of the invention may be better understood by referring to the following description in conjunction with, the accompanying drawings, in which.

DETAILED DESCRIPTION

Figure 1:
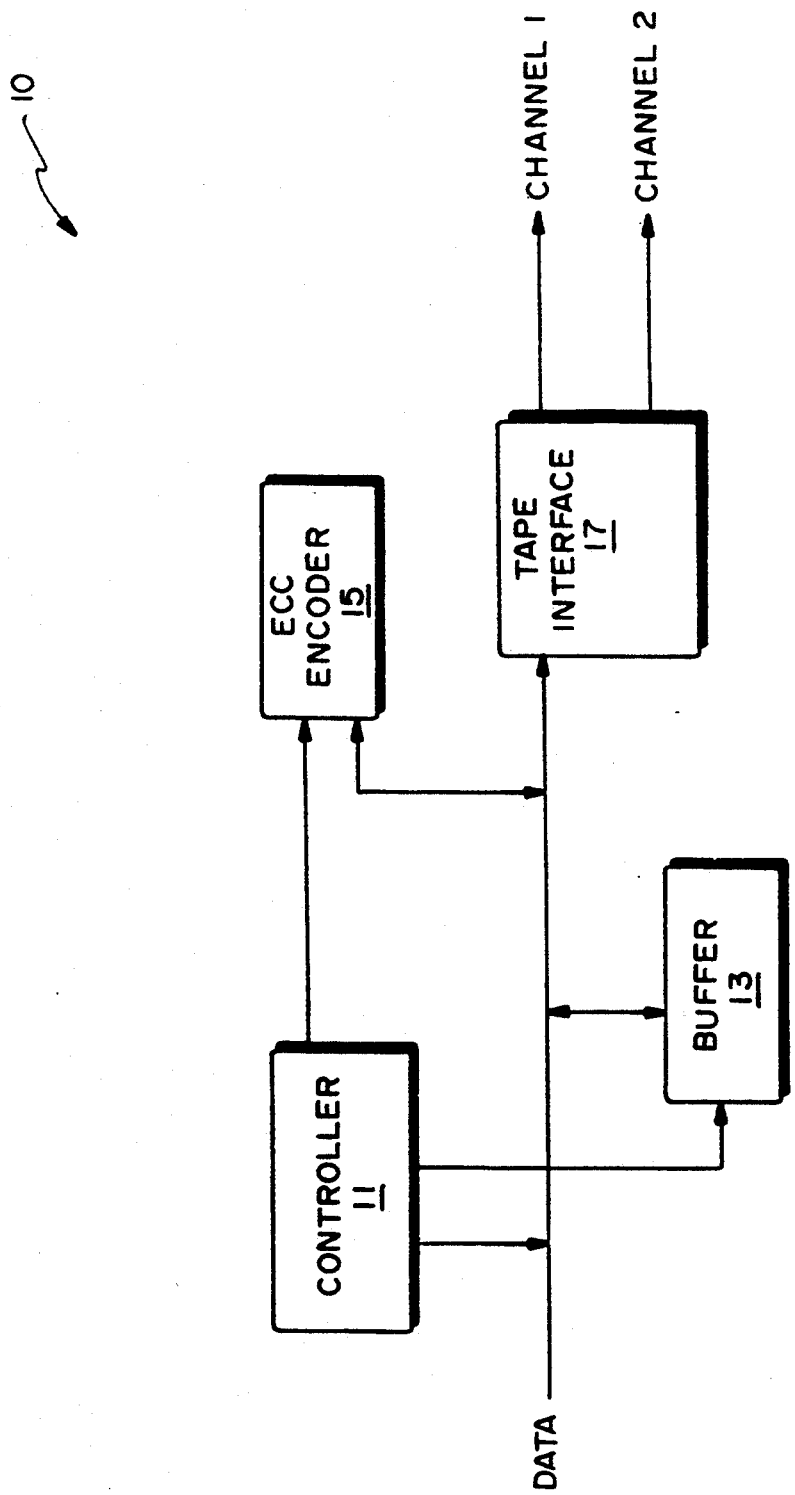
FIG. 1 is a block diagram of an encoding and recording system.

FIG. 1 depicts a system 10 for interleaving, encoding and recording data on an c-channel tape (not shown), where c is two in the illustrative embodiment. The system 10 includes an encoder 15 which is configured to encode the data using an (n,k) ECC, where n=20 and k=4 in the embodiment. The encoder 15 thus encodes 16 data symbols to generate 4 ECC symbols. The 16 data symbols and the 4 ECC symbols together form a 20-symbol code word.

Figure 2:
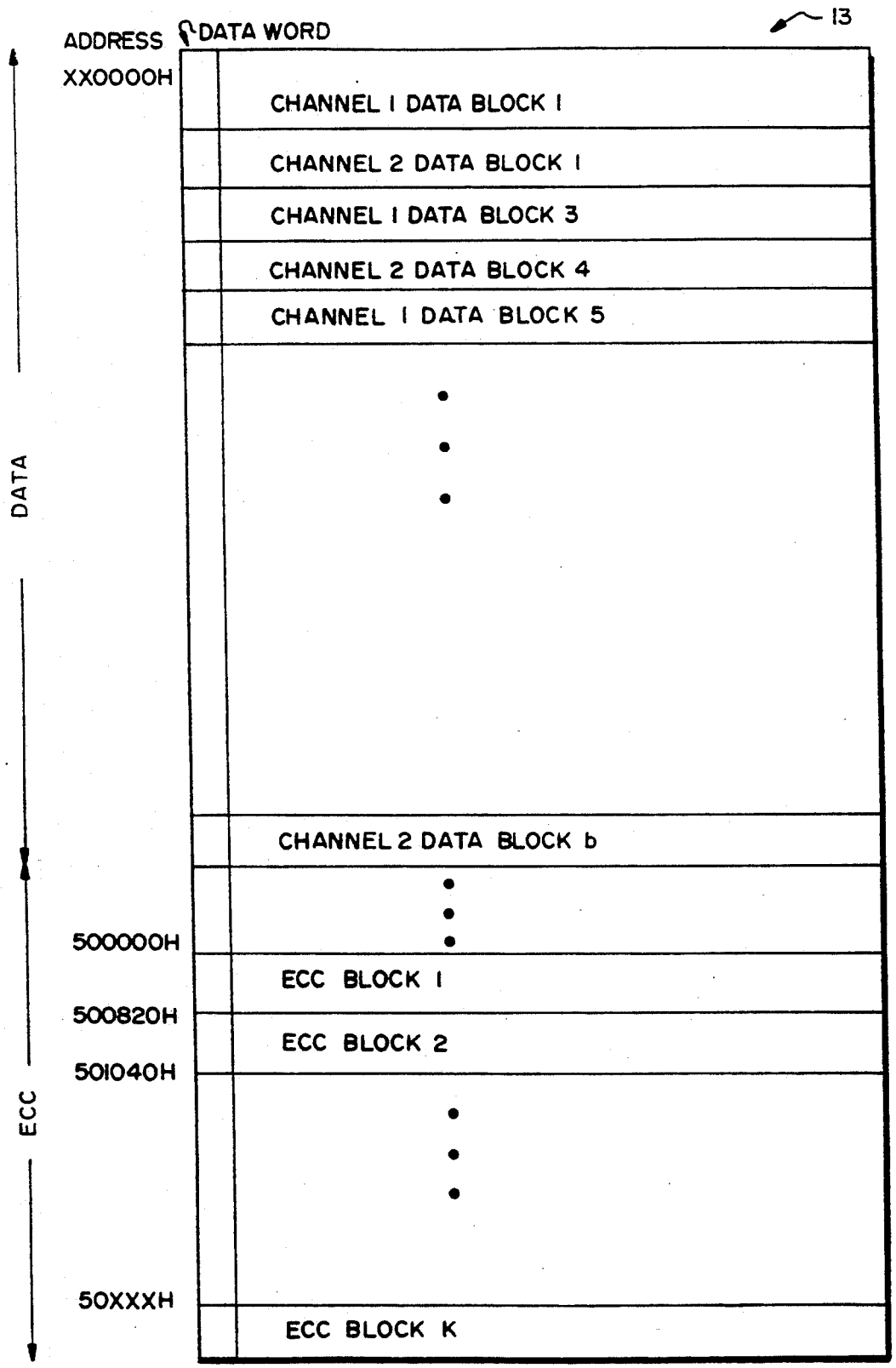
FIG. 2 is a diagram of the contents of a data buffer in the system illustrated in FIG. 1.

When the system 10 receives blocks of data for recording, it. stores them in a buffer 13. The buffer 13 is schematically arranged as a matrix with the data blocks stored in rows. The buffer 13 includes 4 rows, schematically arranged beneath the data rows, for the storage of 4 multi-symbol ECC blocks. The buffer thus aligns the corresponding symbols of the data blocks and the ECC blocks in columns. The ECC block symbols in a particular column relate to the encoding of the data symbols in the same column. At the start of a recording operation the ECC block storage locations contain all-ZERO preliminary ECC redundancy symbols. FIG. 2 depicts a schematic representation of the contents of buffer 13.

Figure 3A:
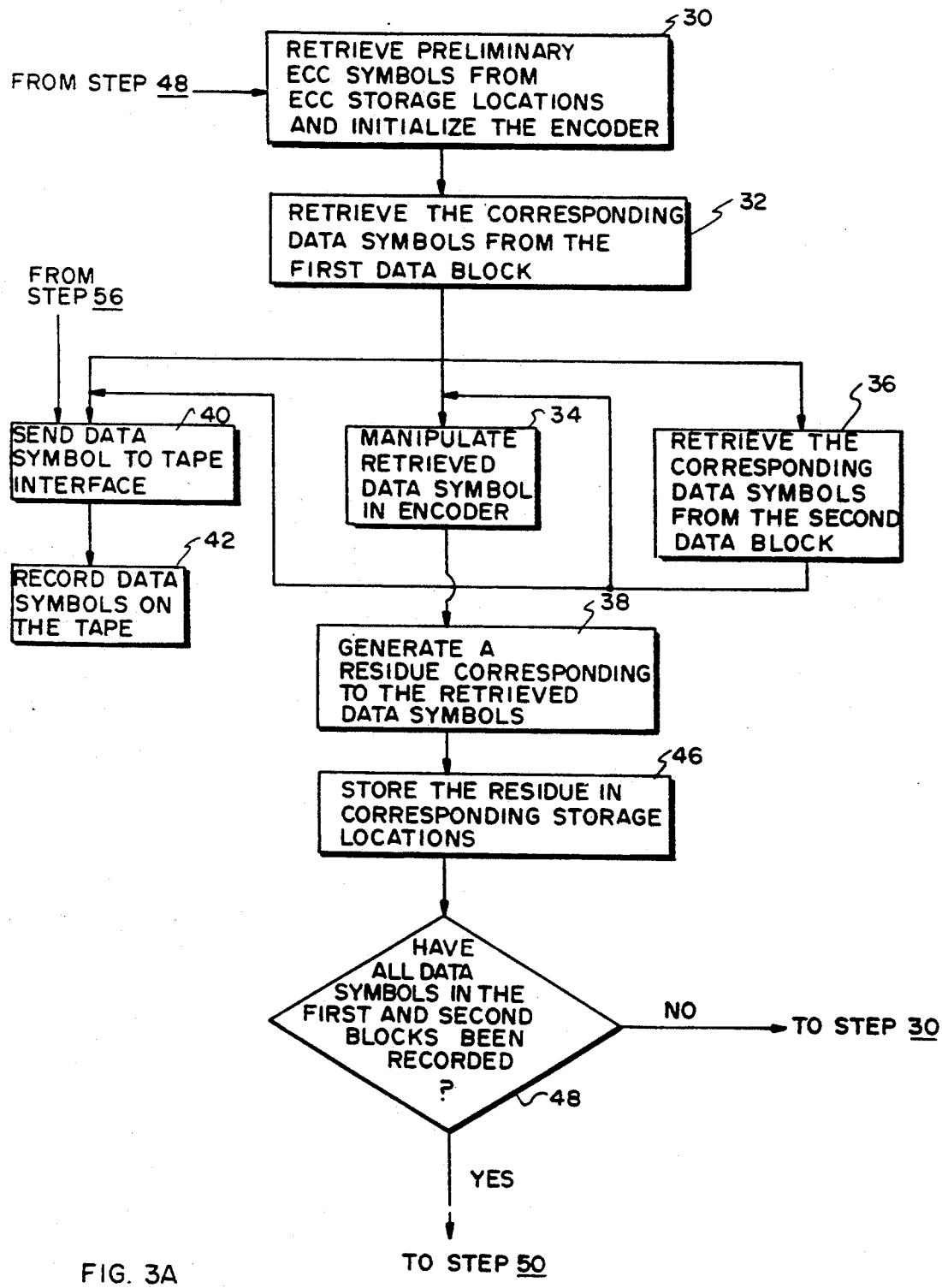
FIG. 3A, 3B and 3C are a flow chart of the steps performed by the system of FIG. 1.
Figure 3B:
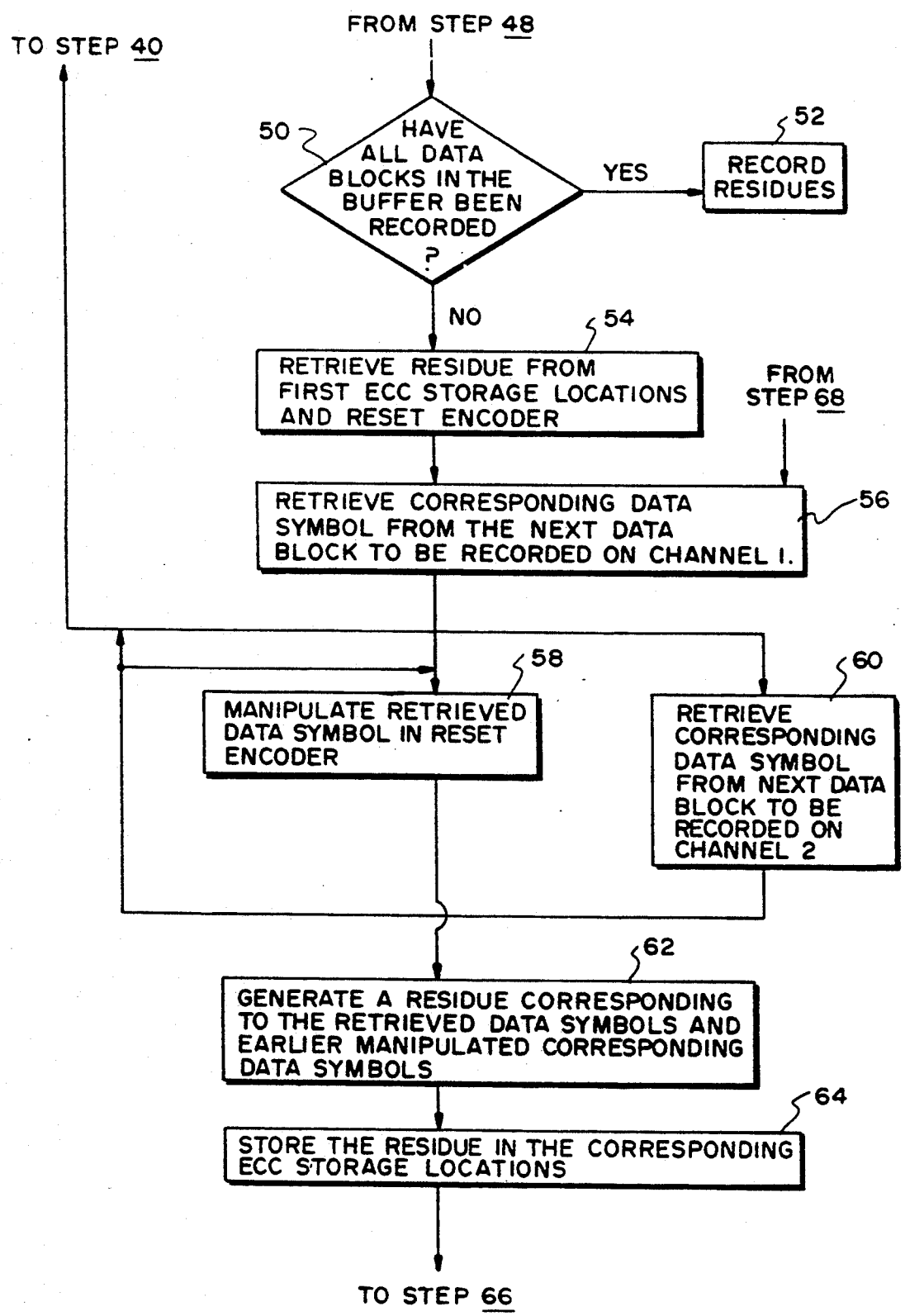
Figure 3C:
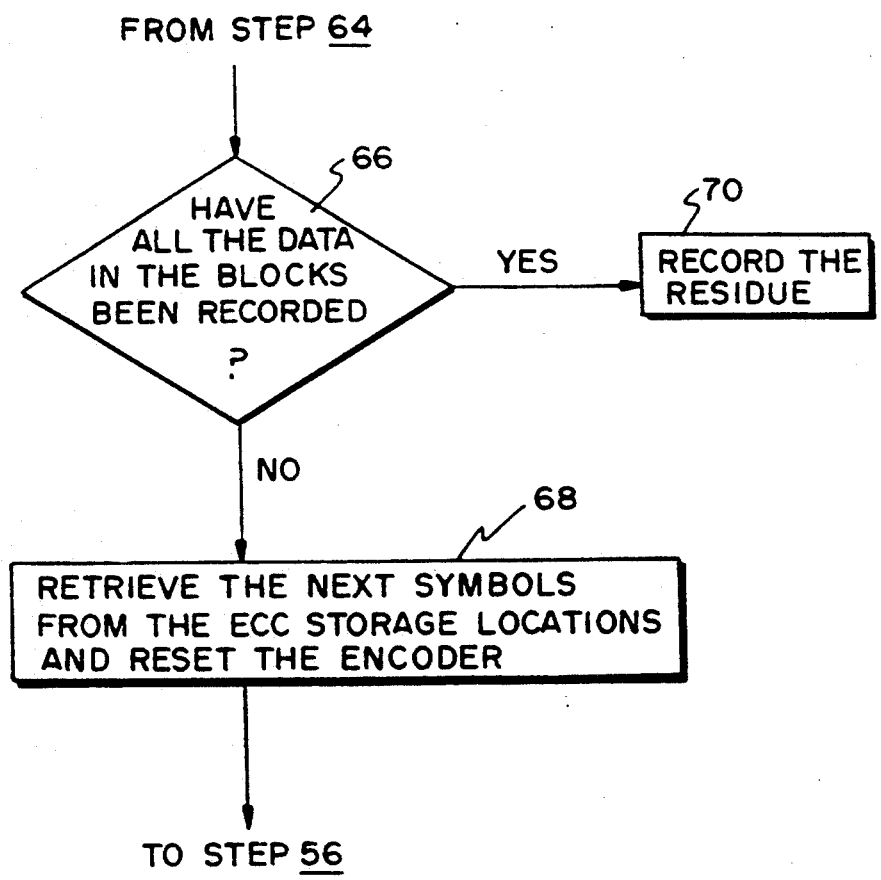

Referring now to FIG. 1 in conjunction with FIG. 3, which is a flow chart of the operations of the system I0, a recording operation begins with a system controller 11 retrieving the first preliminary ECC symbol from each of the 4 ECC rows of buffer 13, schematically the symbols in the first column of the ECC rows. The controller Il sends these symbols to the encoder 15 to initialize it (step 30). The controller 11, next, serially retrieves the first data symbols from the first two buffered data blocks and applies them, at the same time, to the initialized encoder 15 and to a tape interface 17 for recording (steps 32, 36 and 40).

While the tape interface 17 records the data symbols in the two tape channels, the encoder 15 manipulates the data symbols in accordance with the ECC and generates a corresponding residue (steps 34 and 38). The controller 11 then sends the residue symbols to the buffer 13 for temporary storage (step 46) The buffer 13 stores these residue symbols ir the storage locations in the first column of the ECC rows.

The controller Il then retrieves the next, or second, preliminary ECC symbol from each of the ECC rows in the buffer 13 and uses them to re-initialize the encoder 15 (step 48). The controller 11 thus prepares the encoder 15 to encode the second set of data symbols from the first two data blocks. The controller 11 serially retrieves these second data symbols from the buffer 13 and sends them, at the same time, to the reinitialized encoder and to the tape interface 17. As the tape interface 17 records the symbols in the appropriate tape channels, the encoder 15 manipulates them and generates a corresponding residue. The controller 11 then sends the residue symbols to the buffer 13 for temporary storage. The buffer 13 stores the residue symbols in the second storage locations of the ECC rows.

The system continues retrieving preliminary ECC symbols and corresponding data symbols, recording and manipulating the retrieved data symbols and generating and storing residues until all the data symbols in the first two blocks have been recorded on the tape (step 48).

The ECC rows now contain residues which relate to the manipulation of the data symbols in the first two storage locations of the corresponding columns, and the system is ready to record the next two data blocks. The controller 11 first retrieves from the first storage locations in each of the ECC rows the residue symbols stored therein, and loads the symbols in the encoder 15. It thus re-sets the encoder to the state in which is was after it manipulated the first two data symbols of data blocks 1 and 2. The controller 11 then retrieves the first two data symbols from blocks 3 and 4 and sends them to the re-set encoder 15 and the tape interface 17 for recording (steps 54).

While the tape interface 17 records the data symbols in the two tape channels, the encoder 15 manipulates them and generates a new residue. This residue relates to the first data symbols from blocks 1, 2, 3 and 4. The controller 11 then sends the residue symbols to the buffer 13 for storage, and the buffer 13 stores them in the first storage locations of the ECC rows (steps 56-64).

The controller 11 next retrieves the residue symbols stored in the second locations of the ECC rows, re-sets the encoder 15 and retrieves the corresponding data symbols from blocks 3 and 4. It sends these data symbols to the tape interface 17 and the re-set encoder 15 and repeats its manipulation and residue storing operations. It then continues recording and manipulating the rest of the data symbols in blocks 3 and 4, and blocks 5 and 6, and so forth, in the same manner (steps 66–68).

Figure 4:
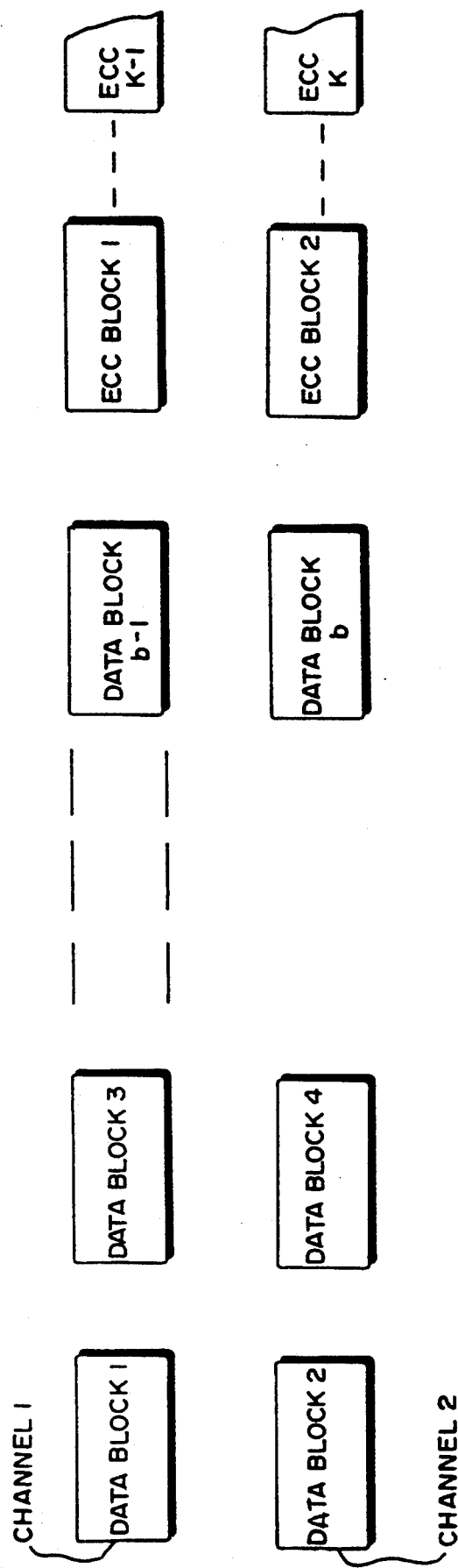
FIG. 4 is a block diagram of a recording format for data recorded by the system of FIG. 1.

After all the data symbols in all 16 of the data blocks of buffer 13 have been manipulated and serially recorded, the ECC rows of the buffer contain residue symbols which relate to the manipulation of all the data blocks. These residues are the ECC symbols which together with the data in the corresponding columns form ECC code words. The controller 11 retrieves these ECC symbols from the buffer 13 and serially records them in the two tape channels, in the format shown in FIG. 4 (step 70).

Figure 5:
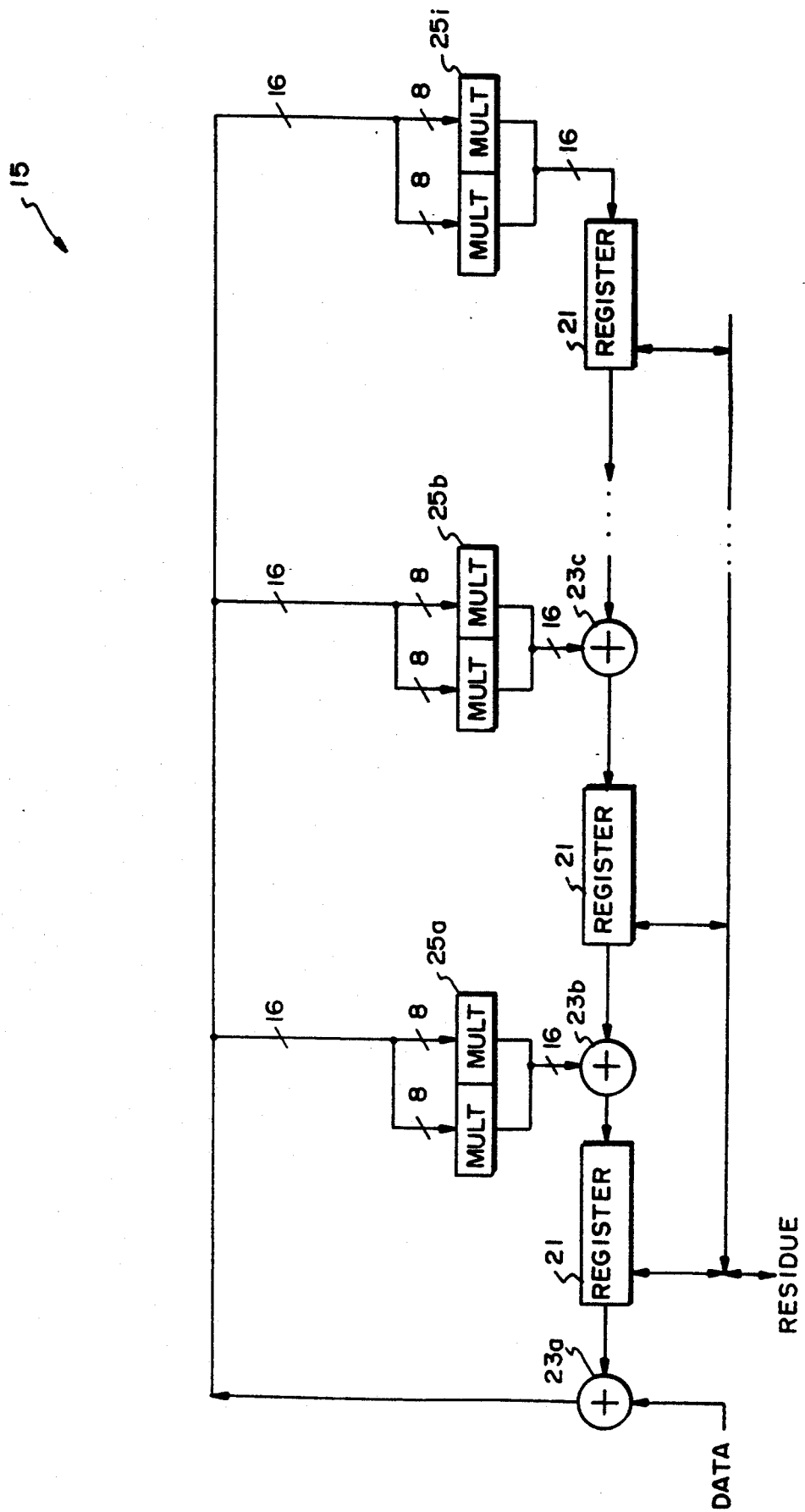
FIG. 5 is a block diagram of an encoder in the system illustrated in FIG. 1.

Referring now to FIG. 5, the operations of the encoder in manipulating the data symbols are discussed in more detail. At the start of a recording operation the system initializes the encoder 15, using the all-ZERO preliminary ECC symbols, by loading the symbols into registers 21 The controller 11 (FIG. 1) next retrieves the first data symbol from the first data block in buffer 13 and applies the symbol to the encoder 15 through an adder 23. The controller 11, at the same time, sends this data symbol to the tape interface 17 for recording (FIG. 1).

The encoder 15 manipulates the first of the data symbols by multiplying it by the generator polynomial of the ECC, in parallel, in multipliers 25. It then adds the products to the contents of registers 21 using adders 23. In the preferred embodiment, the encoder 15 manipulates a 16-bit data word using two 8-bit multipliers operating in parallel. This enables the encoder to manipulate two bytes of data in the same amount of time in which a conventional encoder takes to manipulate one data byte.

While the encoder 15 is multiplying the first data symbol in multipliers 25, the controller 11 retrieves the first data symbol from the second data block and sends it, in parallel, to the encoder 15 and the tape interface 17. The controller 11 thus applies the data symbol to adder 23a, which adds to it the contents of resister 21a.

The encoder 15 applies the sum to the multipliers 25, in parallel. The multipliers 25 multiply the sum by the generator polynomial and send the products to the adders 23. The adders 23 next add the products to the contents of the registers 21 to generate a residue which corresponds to the manipulation of the first data symbols of the first two data blocks. The controller 11 then unloads the residue from the registers 21 and sends it to the buffer 13 for temporary storage, and loads a next set of symbols into the registers 21 to prepare the encoder 15 for the next set of data symbols.

The residue generated for the first data symbols of data blocks 1 and 2 must be further manipulated along with the first data symbols of data blocks 3, 4, 5 ...,16 to generate residues which are the actual ECC redundancy symbols required to form code words in the (20,4) ECC. Accordingly, the residue generated for blocks 1 and 2 is saved and used in the encoder when the first symbols of the next two data blocks are to be manipulated, to return the encoder to the state it was in when it had encoded the corresponding symbols from blocks 1 and 2. The saved residue is thus loaded back into the registers 21, to return them to the earlier state in preparation for the manipulation of the first symbols of blocks 3 and 4, and thereafter, the remaining data blocks.

In this way the ECC symbols, which correspond to data symbols which are non-contiguously recorded, are generated as the data blocks are being serially recorded, that is, as the data streams serially through both the encoder and the tape interface. While the data is being serially recorded on the tape, it is also being both interleaved and encoded on-the-fly.

The error correction advantage of such an encoding scheme is that each symbol of a data block is essentially in a different code word. Accordingly, if a long burst error occurs it is distributed among a number of code words and it therefore does not exceed the error correcting capability of the code.

Each data block may be further encoded as it passes serially to the tape using an error detection code, for example, a CRC. The CRC may then be used to detect errors in the data blocks, and thus, determine which symbols in an interleaved code word, that is, which symbols in the data columns, are in error. The system can quickly correct the detected errors, which now have known locations in the interleaved code words. Such an encoding scheme is disclosed in a co-pending patent application entitled Error Detection and Correction System For Long Burst Errors, Serial Number 07/373,323, which is assigned to the same assignee as the current invention.

In the preferred embodiment, buffer 13 is a dynamic RAM, or DRAM, which stores the data blocks in consecutive rows and columns and the ECC blocks in locations which can be accessed in page mode. In this way, the residue symbols repeatedly fetched from the ECC storage locations of the buffer, which are required to re-set the encoder before the encoding of each set of 2 retrieved data symbols, can be retrieved from the buffer 13 relatively quickly. Accordingly, the system can perform its data manipulation operations at a faster rate than it could if it had to fetch the residue symbols in k complete addressing steps.

The system stores the ECC blocks with the corresponding symbols in each block aligned, that is, in the same row. The system sends address information to the DRAM which directs it, in a conventional manner, to access the ECC blocks as a continuous page. An address multiplexer (not shown) receives the address information and produces addresses which fetch k aligned residue symbols from the page. The addresses of the aligned residue symbols have the same row address bits and different column address bits. The system can thus address the appropriate storage locations by performing a single row address cycle, which sets the row address bits, followed by k-1 column address cycles, each one appropriately setting the column address bits. Such addressing operations take less time than operations which require k complete row and column cycles.

In the illustrative embodiment, 4 ECC blocks, each containing 2 kilobytes of information, are aligned with the first symbol in each block in the same row. The storage locations are addressed with an 18-bit address, with bits 18-14 and 4-1 assigned to the row address and the remaining bits assigned to the column address. Using this addressing scheme, the ECC blocks must start in memory in locations which are on 16 kilobyte boundaries, that is, in locations with addresses which are 16 kilobytes apart, and thus, have the same 4 higher order bits. As discussed above, the blocks are aligned, and thus, they have the same 4 lower order bits. FIG. 2 illustrates an addressing scheme in hexidecimal notation. The 18-bit addresses from the system are applied to an address multiplexer which assigns the row address bits, bits 18-14 and 4-1, to the 9 higher order bits of the DRAM storage location address and the column address bits, bits 13-5, to the 9 lower order bits of the DRAM address. In this way, a single row address cycle sets bits 18-10, the higher order bits of the DRAM address, and the 4 column address cycles each set the bits 9-1. Accordingly, the 4 column address cycles, which change only the lower order bits of the DRAM address, can be quickly performed.

The DRAM, which has a slower access time than the more expensive static RAMs used in conventional systems, may be used in the current system without adversely affecting the speed of the encoding operation because the residue symbols may be addressed relatively quickly in page mode and, more importantly, because the system performs various aspects of the encoding operation in parallel. The system can thus retrieve data from the DRAM, manipulate it and record it in essentially the same amount of time that it takes a conventional system to serially record the data on the tape. Accordingly, the system can replace expensive static RAMs with less expensive DRAMs without sacrificing system efficiency.

We claim:

1. A data encoding and recording system for interleaving and encoding a set of b multi-symbol data blocks in accordance with an n,k error correction code to generate k multi-symbol blocks of error correction residue symbols and recording the data and residue symbols on a c channel magnetic tape, where b>c, the system including;

A. recording means for serially and sequentially recording in the c channels, symbols forming the b data blocks;

B. data receiving means for receiving data symbols in the order in which they are to be recorded and applying the symbols both to the recording means and an encoding means;

C. encoding means for interleaving and encoding the received data symbols to generate residue symbols as the data symbols are being recorded, the encoding means including:

i. an encoder connected to manipulate the received data symbols and generate residue symbols associated with both the manipulation of the received data symbols and the state of the encoder immediately prior to such manipulation;

ii. storage means for storing the generated residue symbols;

iii. residue symbol retrieval means for retrieving stored residue symbols which are associated with selected data symbols from previously recorded data blocks and setting the encoder to a state identified by the retrieved symbols;

iv. means for strong the generated residue symbols to the storage means; and v. means for applying residue symbols corresponding to the manipulation of b data blocks to the recording means for serial recording on the tape in k multi-symbol blocks;

vi. means for storing a predetermined set of symbols in the storage means after the residue symbols corresponding to the b data blocks have been recorded, whereby the residue symbol retrieval means retrieves symbols from the predetermined set when the first c blocks of each set of the b data blocks are being encoded.

2. The data encoding and recording system of claim 1, wherein the residue symbol retrieval means retrieves residue symbols which are associated with previously recorded data symbols which are part of the same interleaved error correction code word as the received data symbols.

3. The data encoding and recording system of claim 1, wherein the residue symbol retrieval means retrieves, for data symbols which are the first symbols in a code word, a predetermined set of residue symbols.

4. The data encoding and recording system of claim 1, wherein the storage means stores associated residue symbols in storage locations which are addressable in page mode.

5. The data encoding and recording system of claim 1, wherein the data receiving means receives corresponding symbols from each of c data blocks being recorded simultaneously in the c channels.

6. A method of interleaving and encoding a set of b multisymbol data blocks in accordance with an n, k error correction code to generate k multi-symbol blocks of error correction residue symbols and recording the data and residue symbols on a c channel magnetic tape, where b<c, the method including the steps of:

A. receiving data symbols in a predetermined order and applying the symbols both to a recording means for recording on the tape and an encoder means for manipulation in accordance with the n,k error correction code;

B. recording the data symbols in the c channels of the tape in the predetermined order;

C. interleaving and encoding the received data symbols to generate residue symbols by i. setting the encoder to a selected state;

ii. manipulating the received data symbols and generating residue symbols associated with both the manipulation of the received data symbols and the state of the encoder immediately prior to such manipulation;

iii. storing the generated residue symbols;

iv. repeating steps i-iii for the encoding of the data symbols in the first c blocks in a set of b blocks;

v. retrieving stored residue symbols which are associated with selected data symbols from previously recorded data blocks;

vi. setting the encoder to a state identified by the retrieved symbols;

vii. manipulating the received data symbols and generating residue symbols associated with both the manipulation of the received data symbols and the state of the encoder immediately prior to such manipulation;

viii. storing the generated residue symbols;

ix. repeating the steps v-viii for all data symbols in the set of b data blocks, as the data symbols are being serially recorded on the tape; and D. recording on the tape the residue symbols corresponding to the manipulation of the set of b data blocks.

7. The method of data encoding and recording of claim 6, wherein the step of recording the residue symbols includes serially recording the symbols in the c channels of the tape in k multi-symbol blocks.

8. The method of data encoding and recording of claim 6, wherein the step of retrieving residue symbols includes retrieving residue symbols which are associated with previously recorded data symbols which are part of the same interleaved error correction code word as the received data symbols.

9. The method of data encoding and recording of claim 8, wherein the step of setting the encoder to a selected state includes:
   storing, prior to the encoding of the b data blocks, a predetermined set of residue symbols; and
   retrieving, for the first data symbols in a code word, the residue symbols from the predetermined set and setting the encoder to a state identified by the retrieved symbols.

10. The method of data encoding and recording of claim 6, wherein the step of storing generated residue symbols includes storing associated residue symbols in storage locations which are addressable in page mode.

11. The method of claim 6, wherein the step of receiving data symbols includes receiving corresponding symbols of c data blocks being recorded simultaneously in the c channels.

* * * * *